US012765077B2

(12) United States Patent
Compaan

(10) Patent No.: US 12,765,077 B2
(45) Date of Patent: Oct. 13, 2026

(54) SEMITRANSPARENT PHOTOVOLTAIC MODULE AND METHOD OF MAKING THE SAME

(71) Applicant: TOLEDO SOLAR INC., Perrysburg, OH (US)

(72) Inventor: Alvin Compaan, Holland, OH (US)

(73) Assignee: TOLEDO SOLAR INC., Perrysburg, OH (US)

(*) Notice: Subject to any disclaimer, the term of this patent is extended or adjusted under 35 U.S.C. 154(b) by 0 days.

(21) Appl. No.: 18/866,112

(22) PCT Filed: May 16, 2023

(86) PCT No.: PCT/US2023/022357
§ 371 (c)(1),
(2) Date: Nov. 15, 2024

(87) PCT Pub. No.: WO2023/224976
PCT Pub. Date: Nov. 23, 2023

(65) Prior Publication Data

US 2025/0338636 A1 Oct. 30, 2025

Related U.S. Application Data

(60) Provisional application No. 63/342,478, filed on May 16, 2022.

(51) Int. Cl.
*H10F 19/80* (2025.01)
*H10F 10/162* (2025.01)
(Continued)

(52) U.S. Cl.
CPC ......... *H10F 19/807* (2025.01); *H10F 10/162* (2025.01); *H10F 19/33* (2025.01); *H10F 19/37* (2025.01); *H10F 71/125* (2025.01)

(58) Field of Classification Search
CPC ........ H10F 19/33; H10F 19/37; H10F 19/807; H10F 71/125; H10F 10/16
See application file for complete search history.

(56) References Cited

U.S. PATENT DOCUMENTS

2004/0219801 A1* 11/2004 Oswald .................. B23K 26/40 438/778
2014/0030841 A1 1/2014 Armstrong et al.
(Continued)

FOREIGN PATENT DOCUMENTS

WO 2015/126918 A1 8/2015

OTHER PUBLICATIONS

U.S. Patent and Trademark Office, International Search Report and Written Opinion issued Aug. 14, 2023, which pertains to PCT Application No. PCT/US2023/022357. 8 pages.

*Primary Examiner* — Mayla Gonzalez Ramos
(74) *Attorney, Agent, or Firm* — Thompson Hine LLP

(57) ABSTRACT

A semitransparent photovoltaic module includes a submodule with a first glass layer, a transparent conducting oxide layer, a semiconductor layer, and a metal back contact layer. The submodule further includes a plurality of interconnection scribes extending in a first direction across the submodule and a plurality of light transmission scribes disposed perpendicularly to the plurality of interconnection scribes in a second direction. The module may further include a lamination layer and a second glass layer and have a visible light transmission of about 7% to about 70% and is capable of generating about 60 W to about 120 W of power. In one embodiment, the light transmission scribes are about 0.05 mm to about 1 mm wide, with a pitch of about 1 mm to about 5 mm.

17 Claims, 15 Drawing Sheets

(51) Int. Cl.

| | |
|---|---|
| ***H10F 19/33*** | (2025.01) |
| ***H10F 19/37*** | (2025.01) |
| ***H10F 71/00*** | (2025.01) |

(56) References Cited

U.S. PATENT DOCUMENTS

| | | | |
|---|---|---|---|
| 2016/0087579 | A1 | 3/2016 | Moslehi |
| 2019/0305166 | A1 | 10/2019 | Compaan et al. |

* cited by examiner

SEMITRANSPARENT PHOTOVOLTAIC MODULE AND METHOD OF MAKING THE SAME

RELATED APPLICATIONS

This application claims priority to U.S. Provisional Patent Application No. 63/342,478, filed on May 16, 2022, entitled Semitransparent Photovoltaic Module and Method of Making the Same, which is incorporated herein in its entirety.

RELATED TECHNOLOGY

This application relates to semitransparent photovoltaic modules for use in building integrated photovoltaics (BIPV), such as high-efficiency photovoltaic windows, facades, and rooftop modules, vehicles, including automotive integrated photovoltaics (AIPV), such as high efficiency sun or moon roofs, windows, and back deck lids, agricultural photovoltaics (agrivoltaics), and floating solar arrays.

BACKGROUND

As the demand for energy efficient products increase, so does the demand for energy-efficient materials that can be incorporated into the envelope of newly constructed buildings, agrivoltaics, floating solar arrays, and vehicles. Historically, photovoltaics (PV) have been used to create thin film cadmium telluride (CdTe) energy panels that can be used to form arrays capable of being connected to the electrical grid.

Today, CdTe technology powers 40% of the (U.S.) domestic utility-scale PV solar market and is expected to reach 60% in the next several years. CdTe Solar PV modules have proven themselves over the last several decades as the most robust, powerful, longest lasting solar technology in the world. However, use of PV modules in residential and commercial building markets, agrivoltaics, floating solar arrays, and in the automotive industry has been lacking.

SUMMARY

In one embodiment, a semitransparent photovoltaic module includes at least one submodule having an outer surface and an inner surface and has a first glass layer, a transparent conducting oxide layer, a semiconductor layer, and a metal back contact layer. In one embodiment, the semiconductor layer is made of CdTe, CdSeTe, CdSe, CdZnTe, CdMgTe, CdHgTe, ZnTe, GaAs, AlGaAs, GaAsP, a-Si, perskovite, CIGS, or combinations thereof. In another embodiment, the semiconductor layer comprises CdTe. While the semitransparent photovoltaic module will be generally described with reference to a CdTe semiconductor layer, it should be understood that the module and submodule, and method of making thereof, may be used for any thin film semitransparent photovoltaic module.

In this embodiment, the submodule further includes a plurality of interconnection scribes extending in a first direction across the submodule and a plurality of light transmission scribes disposed substantially perpendicularly to the plurality of interconnection scribes in a second direction that is substantially perpendicular to the first direction. The plurality of light transmission scribes are generally disposed through at least part of the semiconductor layer.

In another embodiment, the module further includes a first lamination layer disposed on the inner surface of the at least one submodule and a second glass backing layer disposed on an inner surface of the first lamination layer. And, in another embodiment, the module includes a plurality of submodules, and further includes second lamination layer, and a glass outer layer, wherein the plurality of submodules are positioned in sequence between an outer surface of the first lamination layer and an inner surface of the second lamination layer.

In one embodiment, the module has a visible light transmission of about 7% to about 70% and is capable of generating about 60 W to about 120 W of power. In another embodiment, the light transmission scribes are about 0.05 mm to about 1 mm wide and the plurality of light transmission scribes are disposed about 0.25 mm to about 5.0 mm apart.

DETAILED DESCRIPTION

Figure 1:
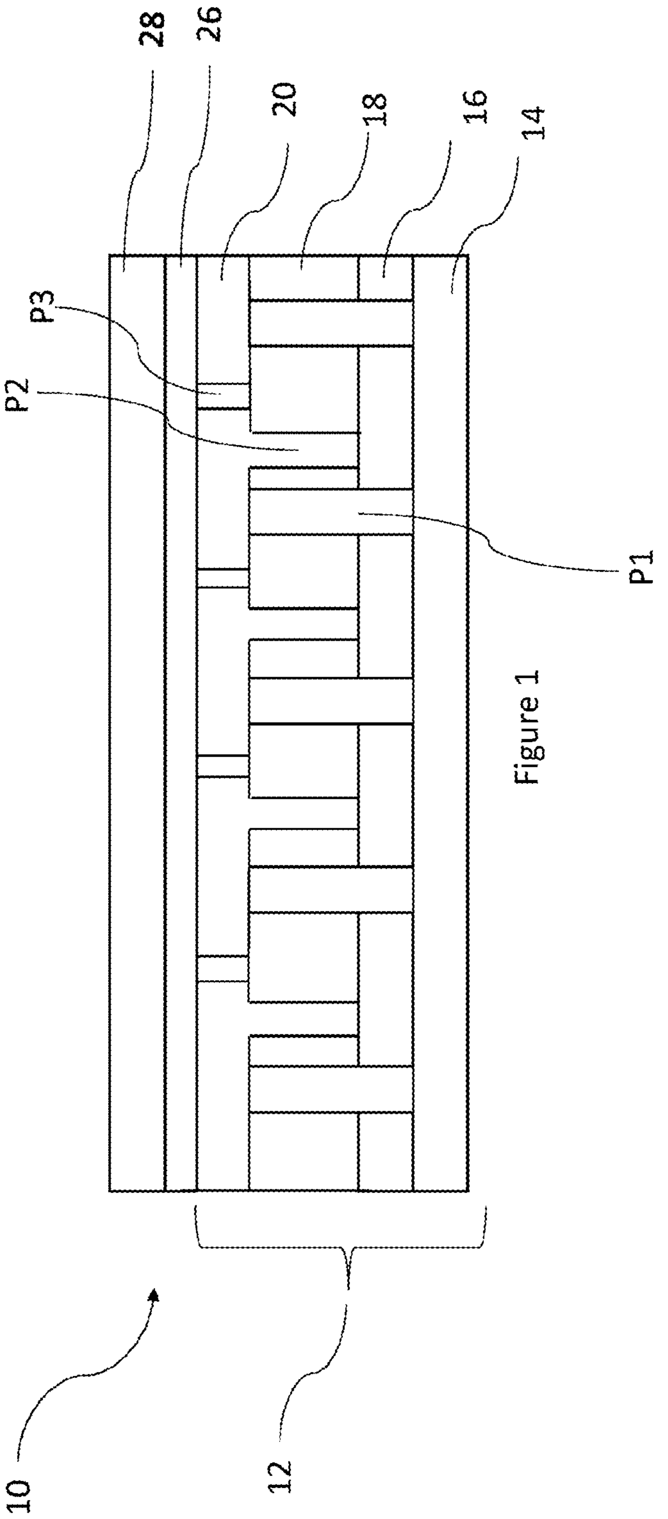
FIG. 1 is a schematic cross-sectional view of a semi-transparent photovoltaic module.
Figure 3:
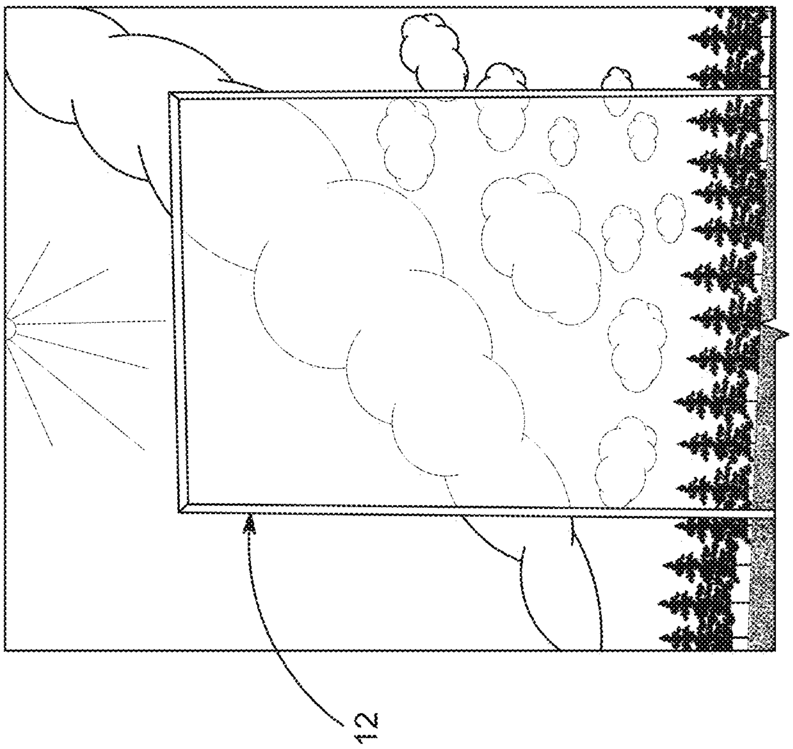
FIG. 3 is a photo of a rear (or interior looking outward) perspective view of one embodiment of the semi-transparent photovoltaic module.
Figure 2:
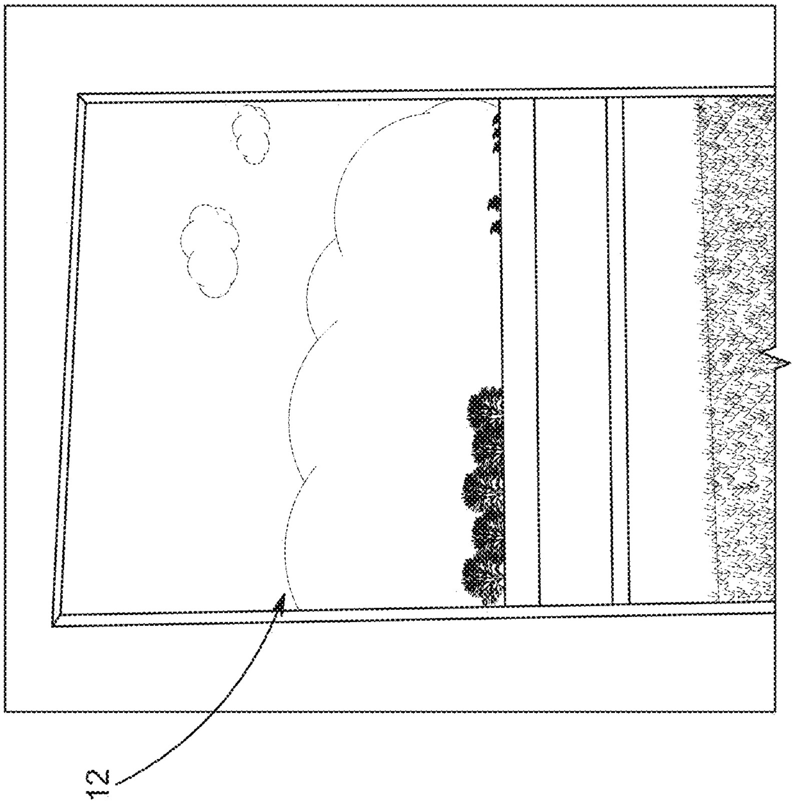
FIG. 2 is a photo of a front (sometimes called "sunny-side" or exterior) perspective view of one embodiment of the semi-transparent photovoltaic module.

As shown in FIG. 1, a semi-transparent PV module 10 for use as high efficiency solar windows, roofing materials, automobile sunroofs, agrivoltaics, floating solar arrays, and the like, is provided. As shown in FIGS. 2 and 3, the semi-transparent PV module 10 may be used as an aesthetically pleasing alternative to traditional window materials, and capable of creating windows with power nearly equal to $(1\text{-}T)\times P_0$, where $P_0$ is the opaque module power and T is the desired light transmission. For example, if T=0.2 (20%) and $P_0$=100 W, then the power from the window module would be (1−0.2)>100=80 W.

Figure 4:
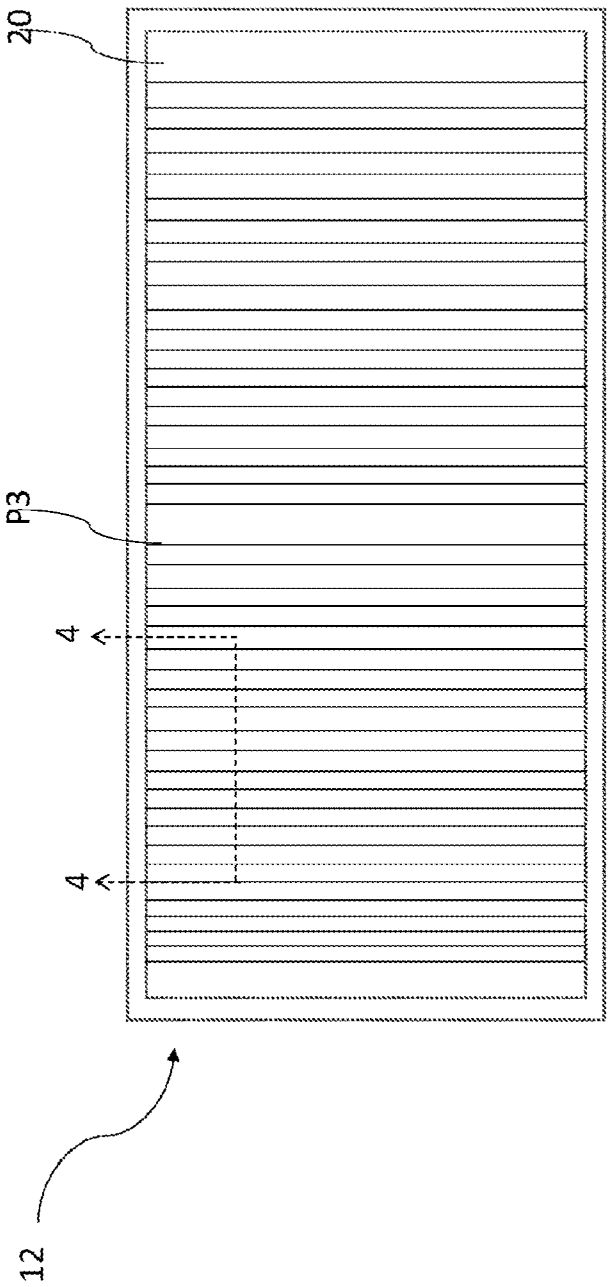
FIG. 4 is a front perspective plan-view representation of a submodule of one embodiment of an opaque photovoltaic module, prior to adding ablation scribes.
Figure 5:
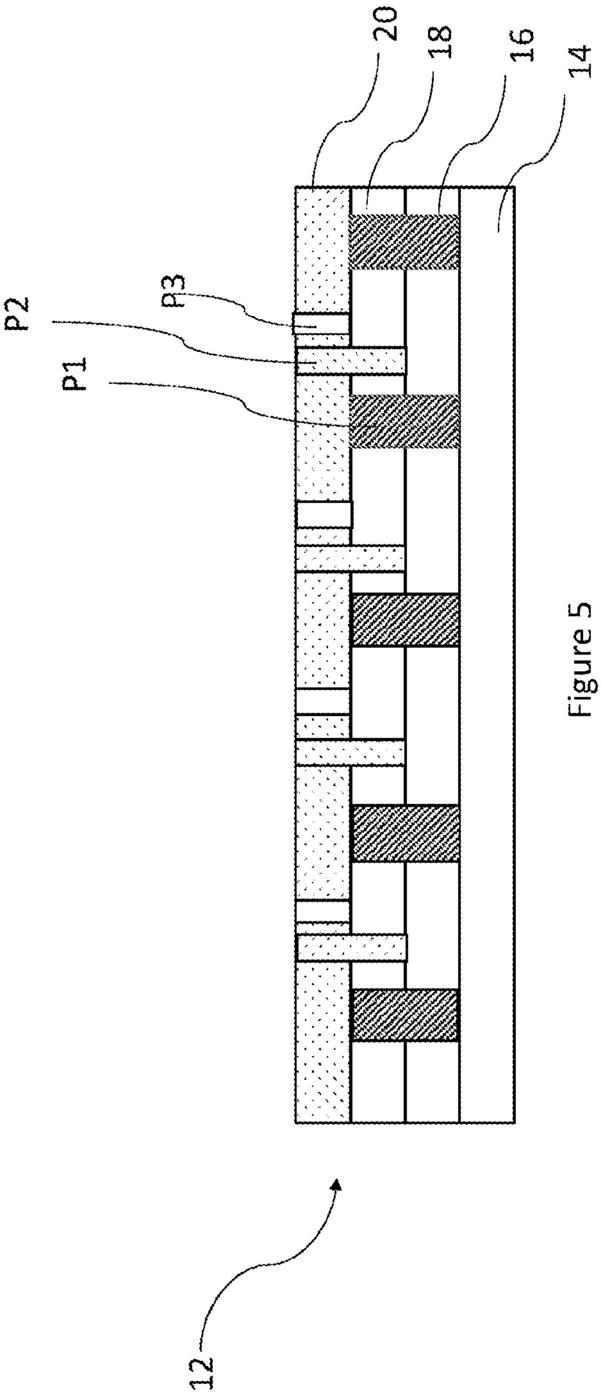
FIG. 5 is a schematic cross-sectional representation of the submodule of FIG. 4 taken along line 4-4.
Figure 6:
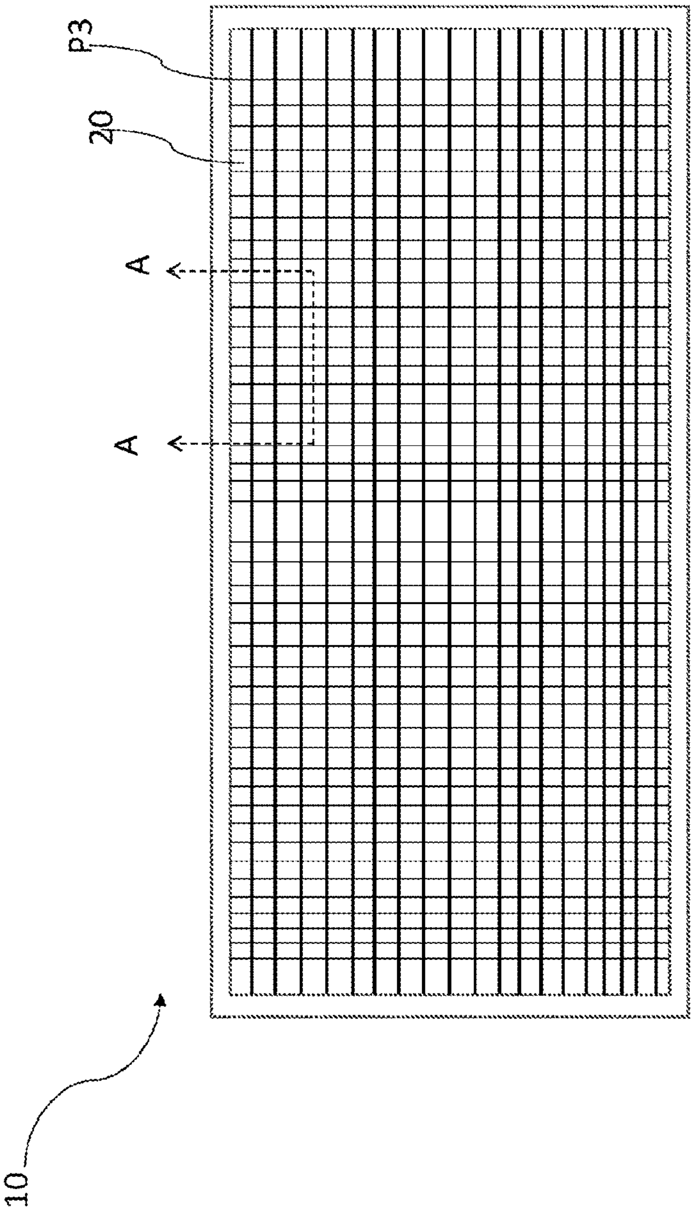
FIG. 6 is a front perspective plan-view of one embodiment of the semi-transparent photovoltaic module including ablation scribes for semitransparency.
Figure 7:
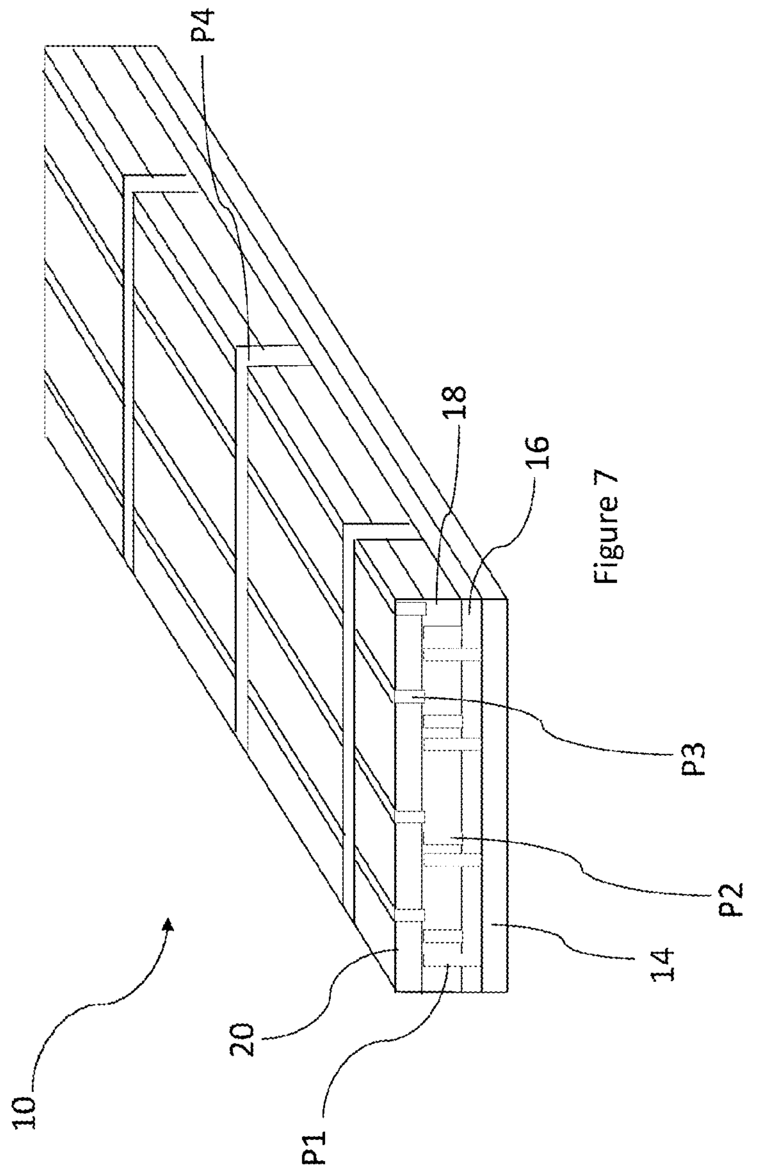
FIG. 7 is a front perspective cross-sectional view of the submodule of FIG. 6 taken along line A-A.

As shown in FIGS. 4 and 5, the semi-transparent PV 10 is created by first constructing an opaque submodule 12, which is then further ablated, as shown in FIGS. 6 and 7, to create the semi-transparent submodule. The opaque CdTe submodule 12 may be created using any known suitable technique, such as the one disclosed in U.S. Pat. No. 9,337,069, which is incorporated herein by reference.

In one embodiment, the opaque submodule 12 includes a glass layer 14, a transparent conducting oxide layer 16, a semiconductor layer 18, and a metal back contact layer 20. In one embodiment the glass layer 14 may be made of soda line glass, but it should be appreciated that any suitable glass material may be used, such as borosilicate glass or yttria-stabilized zirconia. The semiconductor layer 18 may be made of CdTe, CdSeTe, CdSe, CdZnTe, CdMgTe, CdHgTe, ZnTe, GaAs, AlGaAs, GaAsP, amorphous silicon (a-Si), perovskites (such as $CaTiO_3$), copper indium gallium selenide (CIGS), or combinations thereof. In one embodiment, the semiconductor layer is made of CdTe. However, it should be appreciated that the semiconductor layer may be made of any semiconductor material suitable for use in a thin film photovoltaic module.

In one embodiment, the glass layer 14 may be pre-coated with the transparent conducting oxide layer (TCO) 16 that includes a buffer layer of undoped tin oxide ($SnO_2$) or other suitable resistive buffer layer. The Semiconductor layer 18 may then be deposited on top of the TCO layer 16 using any known deposition process. In one embodiment, the Semiconductor layer 18 is deposited on the TCO layer 16 using a vertical vapor transport deposition (VVTD) process, such as the one disclosed in U.S. Pat. No. 9,337,069, incorporated herein, to form a CdTe coated glass substrate. In one embodiment, the semiconductor layer 18 includes a cadmium sulfide layer that is about 50 nm to about 200 nm thick and a cadmium telluride layer that is about 2000 nm to about 4000 nm thick. In another embodiment the cadmium sulfide layer is about 100 to about 200 nm thick, and the cadmium telluride layer is about 2000 to about 4000 nm thick. In yet another embodiment, the semiconductor layer includes a CdSeTe layer about 100 to 200 nm thick and a CdTe layer 2000 nm to 4000 nm thick. The CdSeTe layer may have a gradient of Se ranging from about 40% near the TCO to 0% where it merges with the CdTe. The coated glass substrate is then sprayed with a liquid cadmium chloride solution using an ultrasonic spray machine. The sprayed coated glass substrate is then baked to form an activated CdTe coated glass substate.

The activated coated glass substate is then ablated to form a plurality of P1 laser scribes (or isolation scribes), which dictate how the electrons will flow through the CdTe coated glass substrate and to the connecting buss tape, which is applied later in the process. Each P1 scribe is a 30-50 micron wide scribe that ablates through all material to the glass layer 14. as shown in FIG. 5. The P1 scribes may be used to create about 156 cells (for low voltage modules) to about 117 cells (for high voltage modules) in a 2 foot by 4-foot module. Negative photoresist material (NPR), a UV crosslinking polymer, may be used to fill and insulate the P1 scribes. It should be appreciated that the Negative photoresist material may be any suitable material that will harden or stabilize under light exposure. The NPR may be rolled on to the CdTe coated glass substrate, allowing it to fill the voids left by the P1 scribes. The NPR is then baked to remove excess moisture and exposed to UV light from the uncoated side of the glass layer 14.

The CdTe coated glass substate is then ablated again to form a plurality of P2 laser scribes, each spaced 30-50 microns away from each of the P1 scribes. Each P2 scribe ablates all of the coating materials except for the TCO layer 16. Once filled with a conducting metal, as described below, this scribe will serve as the bridge between the two conductive surfaces, the TCO layer 16 and the metal back contact layer 20.

The metal back contact layer 20 may include three metals, all of which are applied through the process of sputtering or metallization. In a first embodiment, the first metal is molybdenum, followed by aluminum, and finally chromium. In a second embodiment, the first layer is molybdenum nitride, followed by aluminum, and finally chromium. It should be appreciated that other suitable materials may be used for the metal back contact layer 20, such as gold, or silver, or combinations thereof, and non-metals, such as ZnTe. The metals fill the P2 scribes and connect the metal back contact layer 20 to the TCO layer 16.

A plurality of P3 scribes are then ablated through the metal back contact layer 20 and are disposed 30-50 microns away from each respective P2 scribe. The P3 scribe or the rear cell isolation scribe, is the last cell scribe needed to allow the scribed cells to work in series, allowing the electrons to flow from cell to cell on the submodule.

Referring now to FIG. 7, light transmission through the opaque submodule is increased using pulsed laser ablation to remove at least a portion of the absorber material, or semiconductor layer 18 and the metal back contact layer 20, in line, dot, dash or other patterns to create light transmission (ablation) scribe lines P4 that are perpendicular to the interconnect scribe lines P1, P2, and P3. In one embodiment, the semiconductor material can be removed up to the TCO layer 16 so that the low emissivity properties of the TCO-coated glass are preserved. In another embodiment, the TCO layer 16 may be removed. The electrical integration of the cells into modules is unaffected by the transverse ablation scribe lines.

In one embodiment, the ablation lines P4 are created with a pulsed 1064 nm fiber laser having 30-200 nanosecond pulses and operated at 45 kHz repetition frequency and a power of 12 Watts, which is focused to a spot diameter of about 30 microns. The energy per pulse is about 250 microjoules per pulse and the pulse energy per unit area is about 5 to 10 Joules per square cm. The laser spot may be scanned from the glass side of the submodule with a galvanometer to form the ablation scribe lines P4 with an overall width ranging from 30 microns (0.03 mm) to about 500 microns (0.5 mm), or larger depending on the desired ablation width. The separation (pitch) of the ablation scribe lines P4 may range from 100 microns (0.1 mm) to 5000 microns (5 mm). The preferred pitch will depend on the ablation width of the ablation scribe lines and the desired transparency. In one embodiment the ablation scribe line P4 width is 500 microns (0.5 mm) and the pitch is 2500 microns (2.5 mm) to yield a transparency of 20%.

In another embodiment, the ablation lines P4 are created with a pulsed 1030 nm fiber laser operated at 1000 KHz repetition frequency with 10 picosecond pulses and a power of 50 Watts, which is focused to a spot diameter of about 15 microns. The energy per pulse is about 20 microjoules per pulse and the pulse energy per unit area is about 0.2 Joules per square cm.

Figure 8:
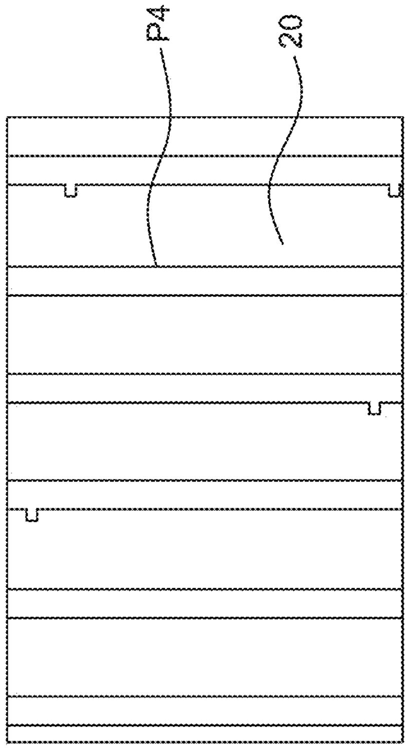
FIGS. 8-11 are illustrations of different embodiments of potential ablation scribe lines.
Figure 9:
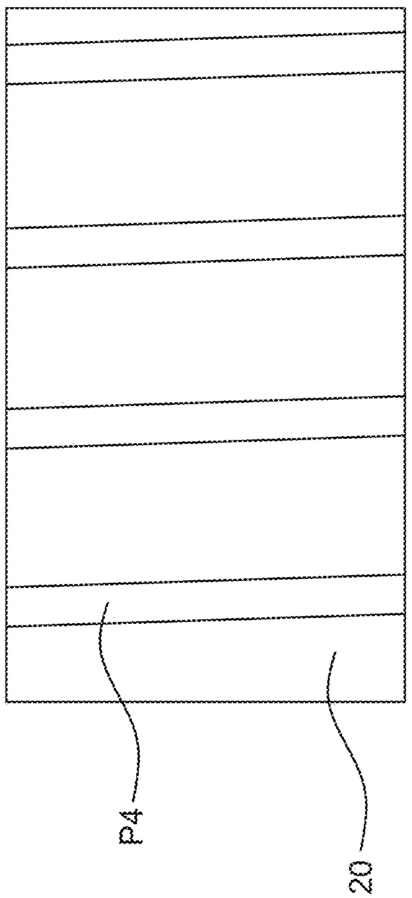
Figure 10:
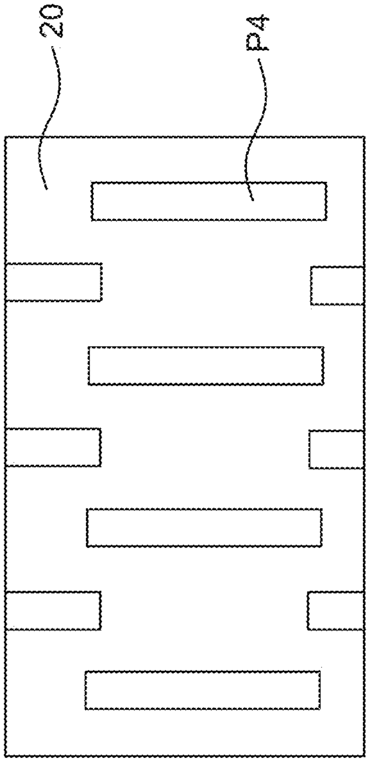
Figure 11:
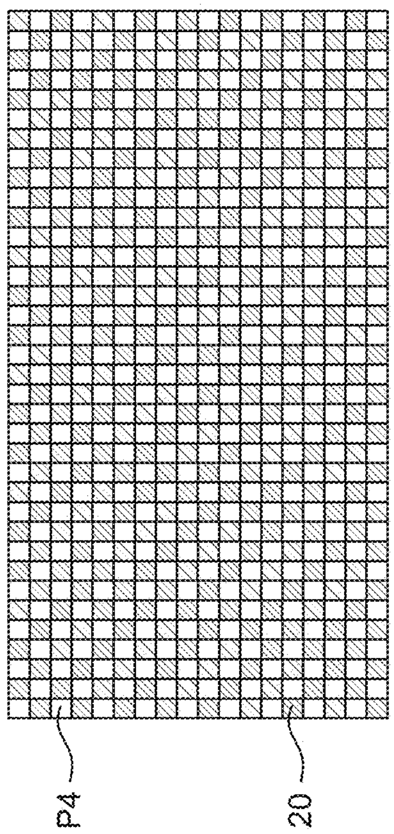

In other embodiments, the ablation scribe lines P4 may be a plurality of 0.19 mm lines with a pitch of about 1.0 mm (FIG. 8), a plurality of 0.28 mm lines with a pitch of about 1.5 mm (FIG. 9), a plurality of 0.28 mm off-set dashed lines with a pitch of about 1.5 mm (FIG. 10), or formed in a checkerboard pattern at 2 mm with a pitch of about 2 mm (FIG. 11).

Generally, the galvanometer head is translated along the length in the ablation scribe line P4 direction (the narrow or first direction), perpendicular to the interconnect P1, P2, and P3 scribes (which are disposed along a second direction), with the galvanometer scanning the spot parallel to the interconnect scribes (P1, P2, and P3) and perpendicular to the ablation scribe line P4 scan direction (or galvanometer head motion). In one embodiment, the ablation scribe lines P4 run in a first direction along a vertical axis of the submodule 12, in another embodiment, the first direction is along the horizonal axis of the submodule 12.

In another embodiment, the pulsed laser may have a wavelength of 532nm, 355 nm, or other suitable wavelength, and can be directed at the semiconductor layer 18 through the glass side 14 of the submodule 12. In another embodiment, the pulsed laser may be directed from the metal back contact layer 20, rather than through the glass layer 14. The ablation scribe lines P4 may be made using lines, dots, square, or other suitable patterns.

Once the ablation scribe lines P4 have been created, the submodule 12 is subjected to a laser edge deletion (LED) process, whereby all of the material around the perimeter of the submodule 12 is removed. In one embodiment, a perimeter of at least 10 mm is created to provide an electrically insulating border between the electrical generating surface and the submodule's 12 most outer edge.

Once the border is created, the submodule 12 undergoes an annealing process and a conductive buss tape 22 (FIGS. 12 and 13) is adhered to the submodule 12. The buss tape configuration collects the electrons from the scribed cells and terminates to the junction box wires (not shown), as described below. In this embodiment, the buss tape extends along the long side of the module and is capable of being attached to edge connectors, which will be disposed inside of a window casing upon installation.

As shown in FIG. 1, the semitransparent photovoltaic module 10 is created by applying a polyisobutylene (PIB) (not shown) to the perimeter surface that was ablated by the LED machine, which will act as a seal between the submodule 12 and the glass backing layer 28. The PIB creates a hermetic seal that keeps the elements away from the semiconductor material. Next, a lamination material layer 26 (e.g., EVA, polyolefin, or a thermoplastic such as PVB or TPU) is applied on top of the PIB border, and 3.2 mm thick glass backing layer 28 of tempered soda lime glass is applied on top of the lamination layer 26. The completed module 10 is then passed through a lamination machine to evacuate any trapped air between the submodule 12 and the glass backing layer 28. A hot press is then applied to squeeze the submodule 12 and the glass backing layer 28 together as it heats, melting the lamination layer 26 and the PIB. The last step is a cool-down while squeezing the laminated module 10 and controlling cooling to create the final product.

Figure 13:
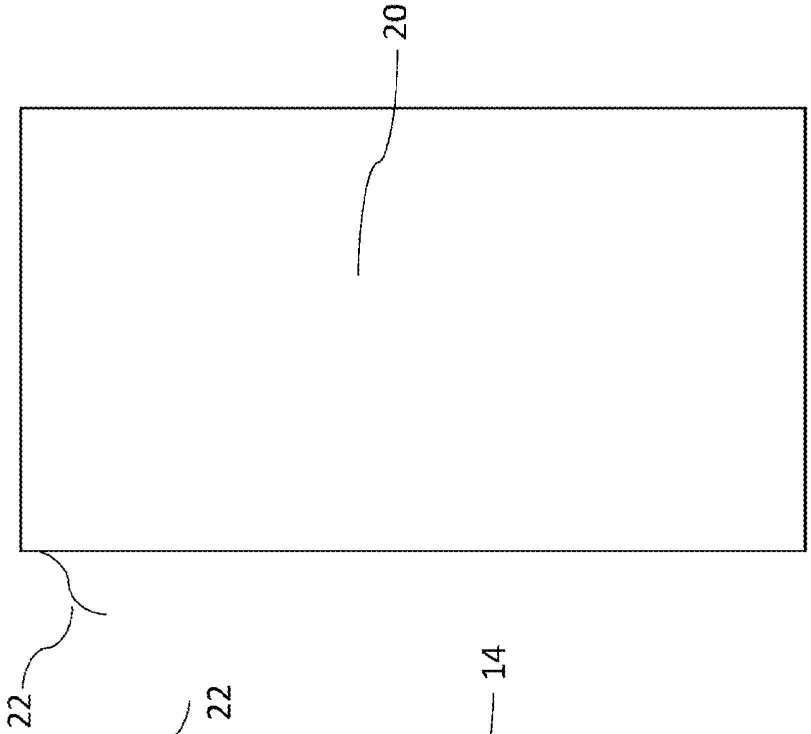
FIGS. 12 and 13 are front and rear plan views of semi-transparent photovoltaic modules.
Figure 12:
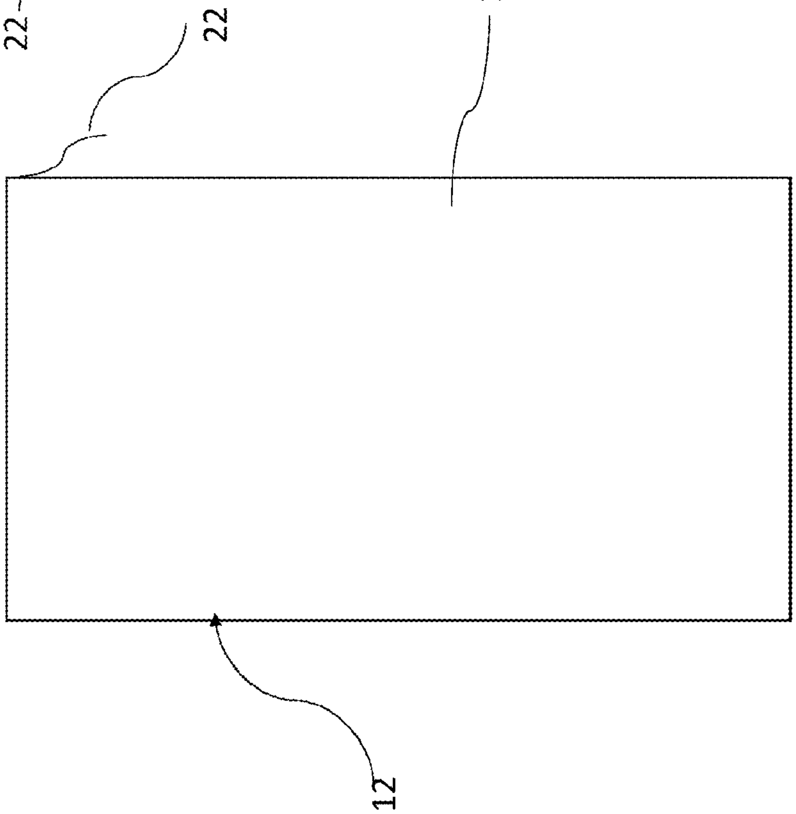

As shown in FIGS. 12 and 13, for a semitransparent photovoltaic window module 10, the buss tape 22 and junction box (not shown) should be mounted on the edge of the module so that it is not visible from the inside or outside when installed.

The light transmission through the semitransparent PV window can be adjusted by choosing the width of the galvanometer scan for the ablation scribe lines and the repeat pitch of the ablation scribe. For example, if the pitch of the ablation scribe is chosen as 2 mm and the width of as 0.5 mm, the light transmission will be about 0.5/2.0, or about 25%. So, the ratio of the ablation scribe width to the ablation scribe pitch will determine the transmissibility of the module. Moreover, the power output of the semitransparent window will be proportional to the fractional area of the opaque module. With a light transmission of 25%, as described above, the power output will be about 1.5/2.0, or 75% of the normal opaque module.

Figure 14:
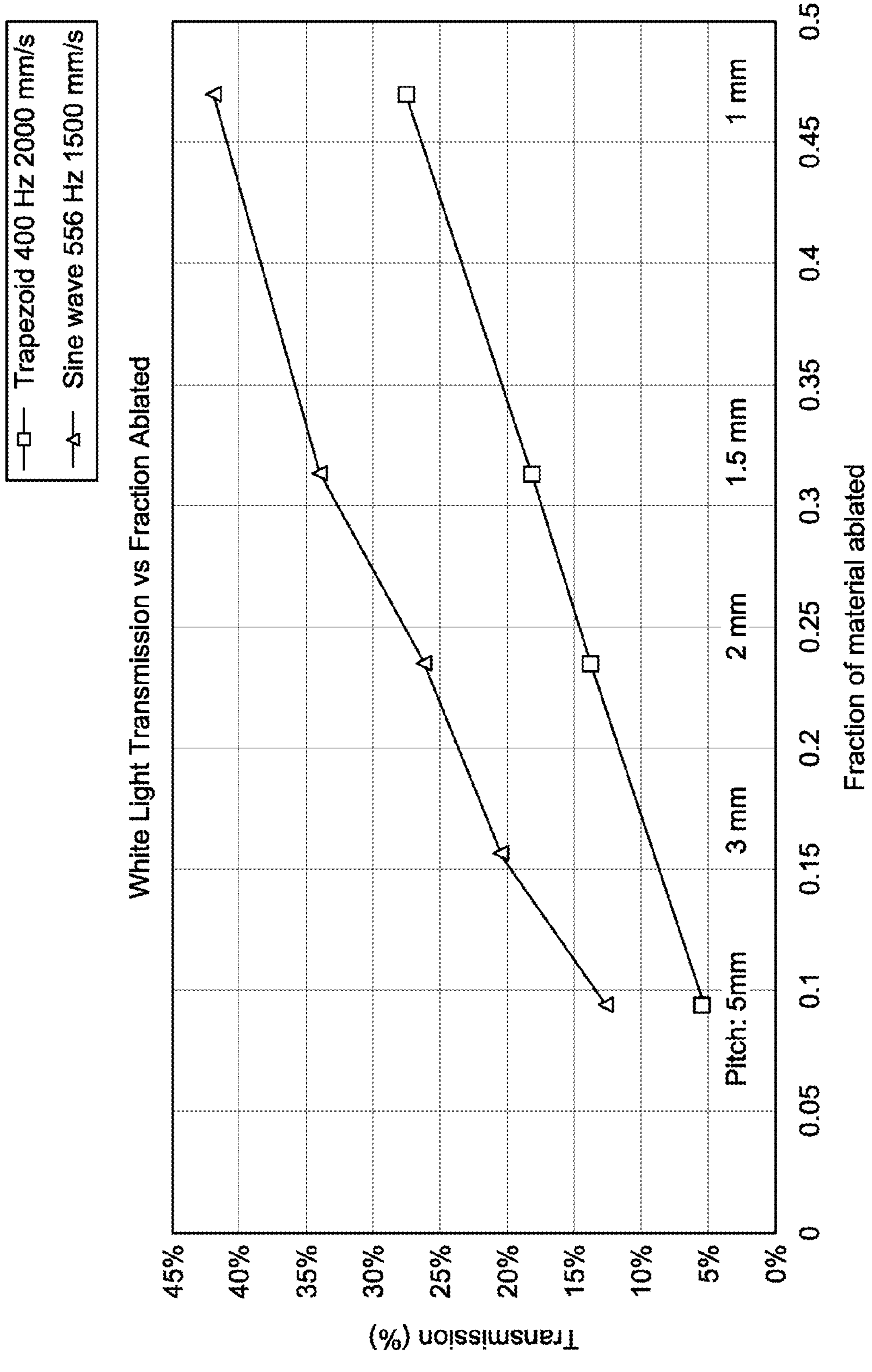
FIG. 14 is a graphical representation of the percentage of white light transmitted through the semi-transparent module as a function of the amount of material ablated from the ablation lines.

FIG. 14 details the white light transmission through the semitransparent photovoltaic module compared to the amount of material ablated. For these calculations, the ablation scribe lines were about 0.47 mm wide. The transmission was controlled by the pitch of the ablation lines so that, for example, a pitch of 5 mm produces an ablation fraction of 0.47 mm/5 mm, or 0.094. In this example, two different galvanometer waveforms (sine and trapezoid) were used to sweep the laser spot across the 0.47 mm wide ablation line. It has been found that a sine waveform yields a smoother ablation and higher transmission. In one embodiment, the semitransparent photovoltaic module may have a visible light transmission of about 7% to about 70%, in another embodiment, about 5% to about 40%, and in another embodiment, about 10% to about 30%. The module may be capable of generating about 60 W to about 120 W of power.

It has been found that the use of laser ablation removal of material to produce semitransparent PV modules has an important benefit for thin-film PV in addition to being a convenient, precisely controllable, and efficient method to create patterns to allow light to pass through an otherwise opaque module. This added benefit arises from how the ablation scribes can be used to control and guide the flow of electrical current through the panel.

For example, when the ablation process removes certain portions of either or both of the conductive back contact and the conductive and transparent front contact, light-generated current can be restricted from reaching shunting defects that may be present in the film. If, for example, straight-line ablation scribe lines P4 are used along the length of a photovoltaic window module, current will flow only between the ablation scribe lines P4 and not perpendicular to the ablation scribe lines P4. This can be used to prevent the shunting defect from draining power from the region surrounding the shunt, i.e. an electrical short due to a defect in the module material. The ability to isolate this type of defect can be shown using analysis of electroluminescence emission from thin-film modules.

Electroluminescence (EL) is a powerful tool to use for diagnostics and quality control of laser-ablated submodule panels and fully laminated, laser-ablated modules. EL reveals spatially resolved dead areas, shunts and heat-affected zones as well as subtle performance variations across a module or submodule that can degrade the power output of the module.

Figure 15:
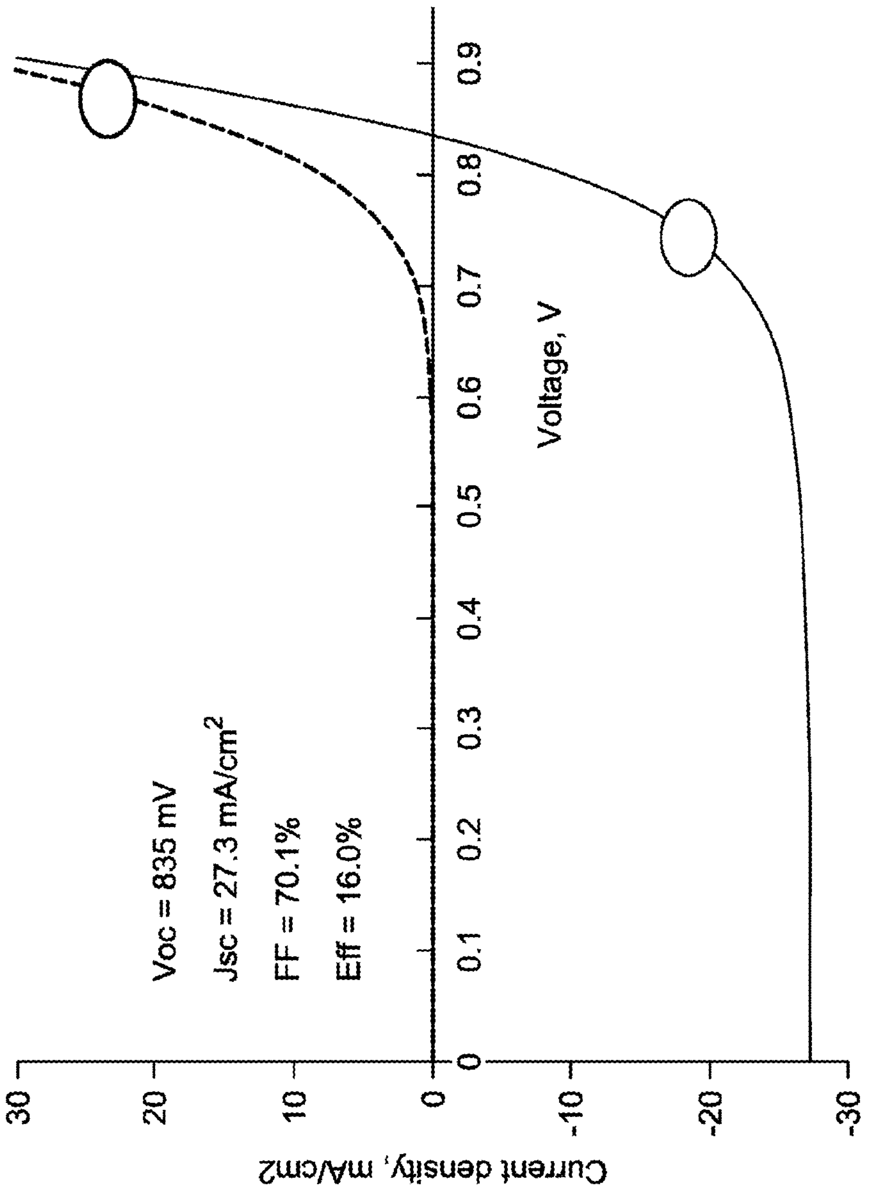
FIG. 15 is a graphical representation of current density vs. voltage curve (J-V curve) for typical photovoltaic modules in the upper curve and under one-sun illumination (i.e. standard illumination at AM1.5, or 1 kW/$m^2$) (lower curve); dots indicate typical cell operating points for electroluminescence (upper dot) and for module power at one-sun illumination with current and voltage at the maximum power point (lower dot)

EL is produced when a cell or module is held in the dark and a forward bias is applied that is slightly greater than open-circuit voltage, as shown in FIG. 15. Without wishing to be bound by theory, it is thought that forward bias produces electron-hole recombination with photon energy slightly lower than the band gap of the semiconductor, e.g., cadmium telluride. This produces near-infrared light emission near 900 nanometers for CdTe or CdSeTe. The emission is imaged with a camera that has a thermo-electrically cooled silicon CCD chip with no Red Green Blue (RGB) color filters in front of individual pixels. The grey-scale image is processed to show a false color response signal proportional to the emission intensity detected by the CCD of the camera. EL is very sensitive to small defects in the thin film layers or shunts in the transparent conducting oxide (TCO)/semiconductor/metal materials stack.

The typical operating point for EL is forward bias above open-circuit voltage (VOC) with forward current density similar in magnitude to the short-circuit reverse current density (JSC ~25 mA/cm2). For the module images in FIGS. 16A and 16B, each individual photovoltaic cell in the module has an area of 45 cm2 (58 cm×0.77 cm). Thus, the images were taken at a forward current of about 1.1 Amp. This module has a total of 152 cells that are monolithically connected in series for the 118 cm length of the panel. (The overall module length is 120 cm with a border of about 1 mm that is "edge deleted" to remove all coatings down to bare glass.)

Figure 16A:
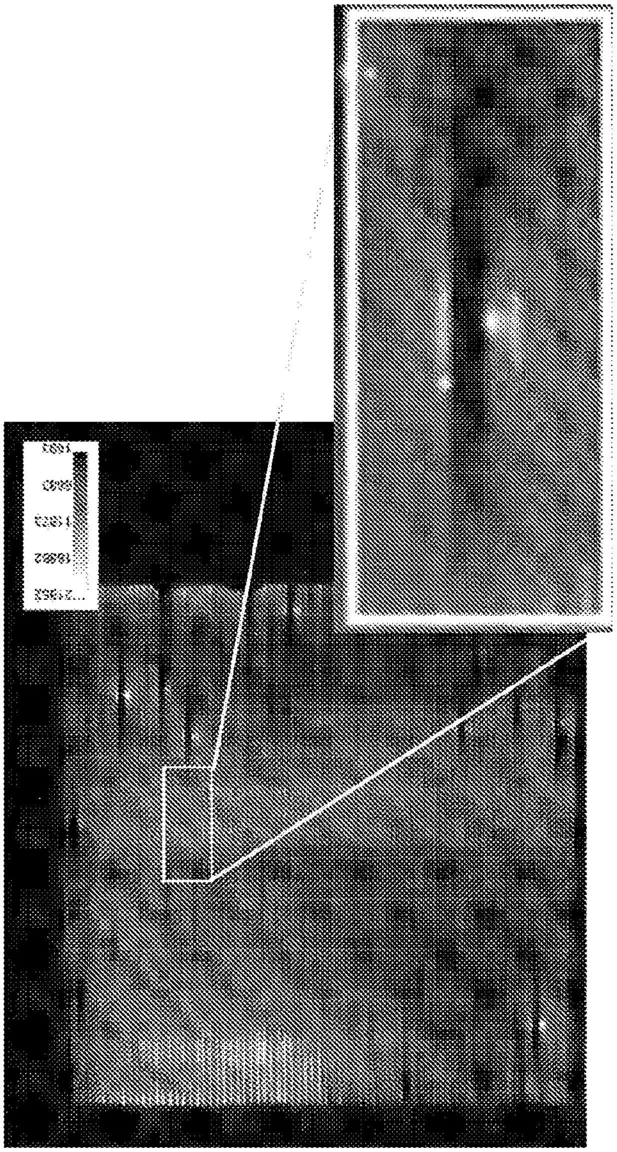
FIGS. 16A and 16B are electroluminescence images from a 2'×2' section of a 2'×4' CdTe thin-film PV panel at 1 A current. 16A is an image of a monolithically interconnected panel prior to ablation and 16B is an image of the same panel after cutting 193 ablation lines.
Figure 16B:
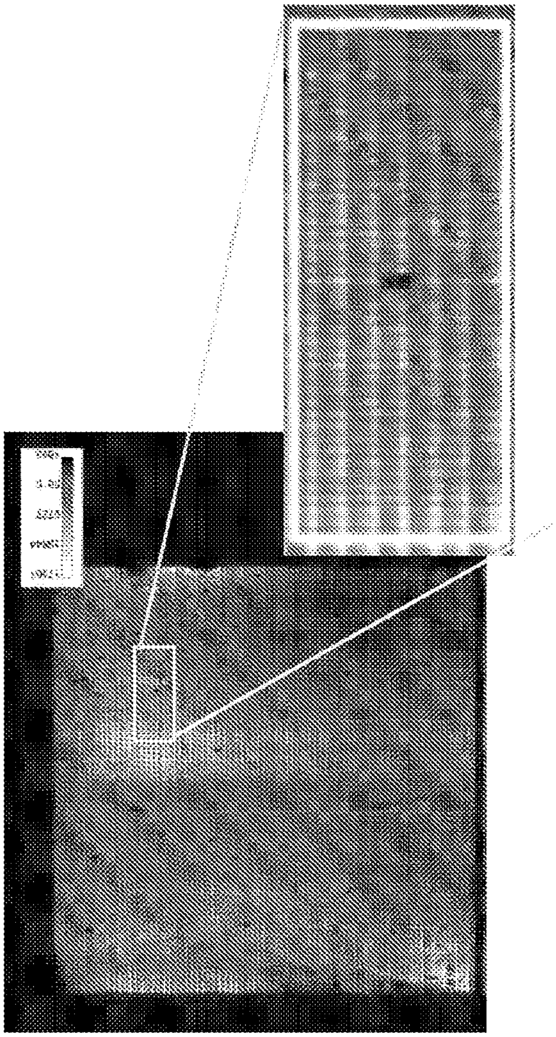

FIG. 16A is an EL image from a 2 ft×2 ft section of a 2 ft×4 ft semitransparent PV panel at 1 A current. The module was monolithically interconnected prior to ablation. FIG. 16B is an EL image of the panel of FIG. 16A after cutting 193 ablation lines P4. The inset shows a magnified image of a section near one strong shunting defect. The horizontal dark lines are from P1, P2, P3 interconnects at 7.7 mm pitch; the vertical dark lines are from laser ablated P4 regions at 3 mm pitch. It should be noted that greyscale image intensities were converted to false-color images using Image-J.

As shown in FIG. 16A, taken prior to ablation, the strong shunt will draw current from nearly ⅓ of the 580 mm width of a cell, or a region of about 200 mm. The resulting drop in voltage on either side of the shunt readily pulls down the forward current density in the region surrounding the shunt (current density is near the black dot in FIG. 16A.) so that the EL emission is greatly reduced near this shunt.

However, as shown in FIG. 16B, the vertical ablation scribes P4 limit the harmful effects of the shunt to one 3 mm horizontal increment between adjacent ablation scribes P4. This results in a more uniform color image in EL after ablation scribes. The more uniform color image indicates more uniform EL intensities across the module because the shunts cannot drain current from more than the 3 mm width between ablation scribes.

Thus, ablation scribing limits the harmful effects of shunting (including loss of power generation) that inevitably occur in large-area thin-film devices. Making semitransparent modules through laser ablation may permit use of modules with a higher density of defects than standard opaque modules. This will improve yield, improve power generation, and reduce manufacturing costs.

Figure 17:
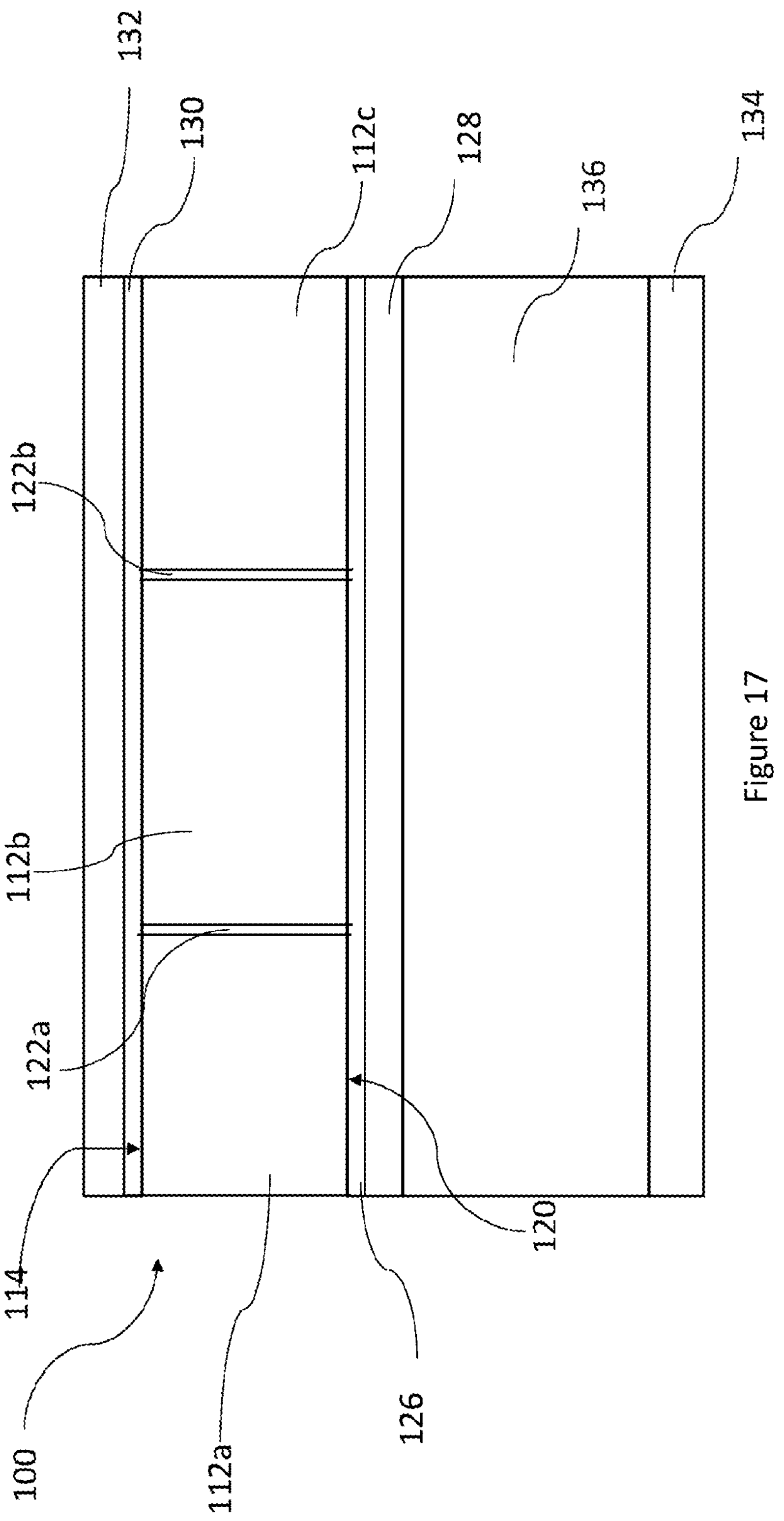
FIG. 17 is a schematic cross-sectional view of a semi-transparent photovoltaic insulated glass unit.
Figure 18:
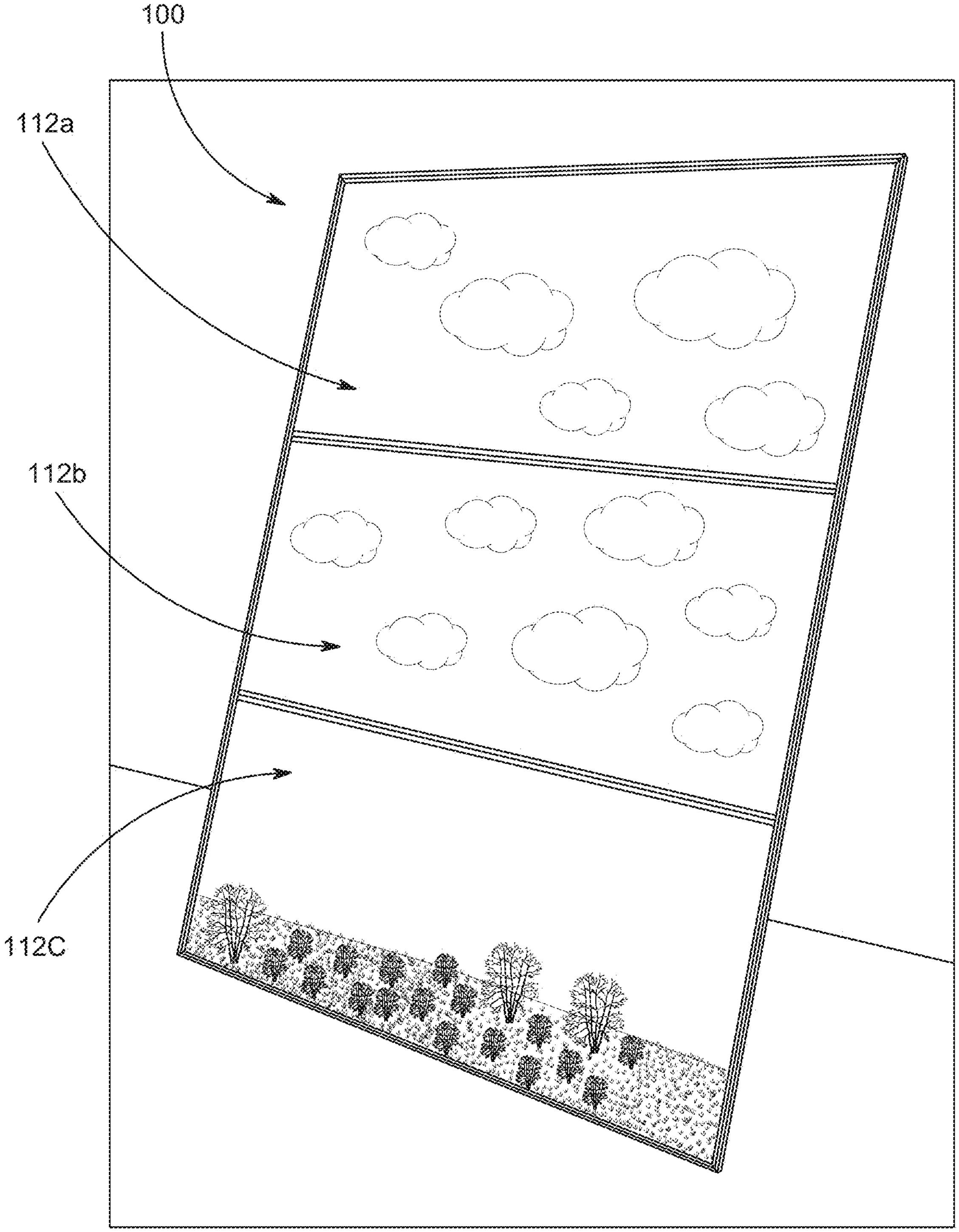
FIG. 18 is a photo of a 4 ft×. 6 ft laminated semi-transparent photovoltaic insulated glass unit.
Figure 19:
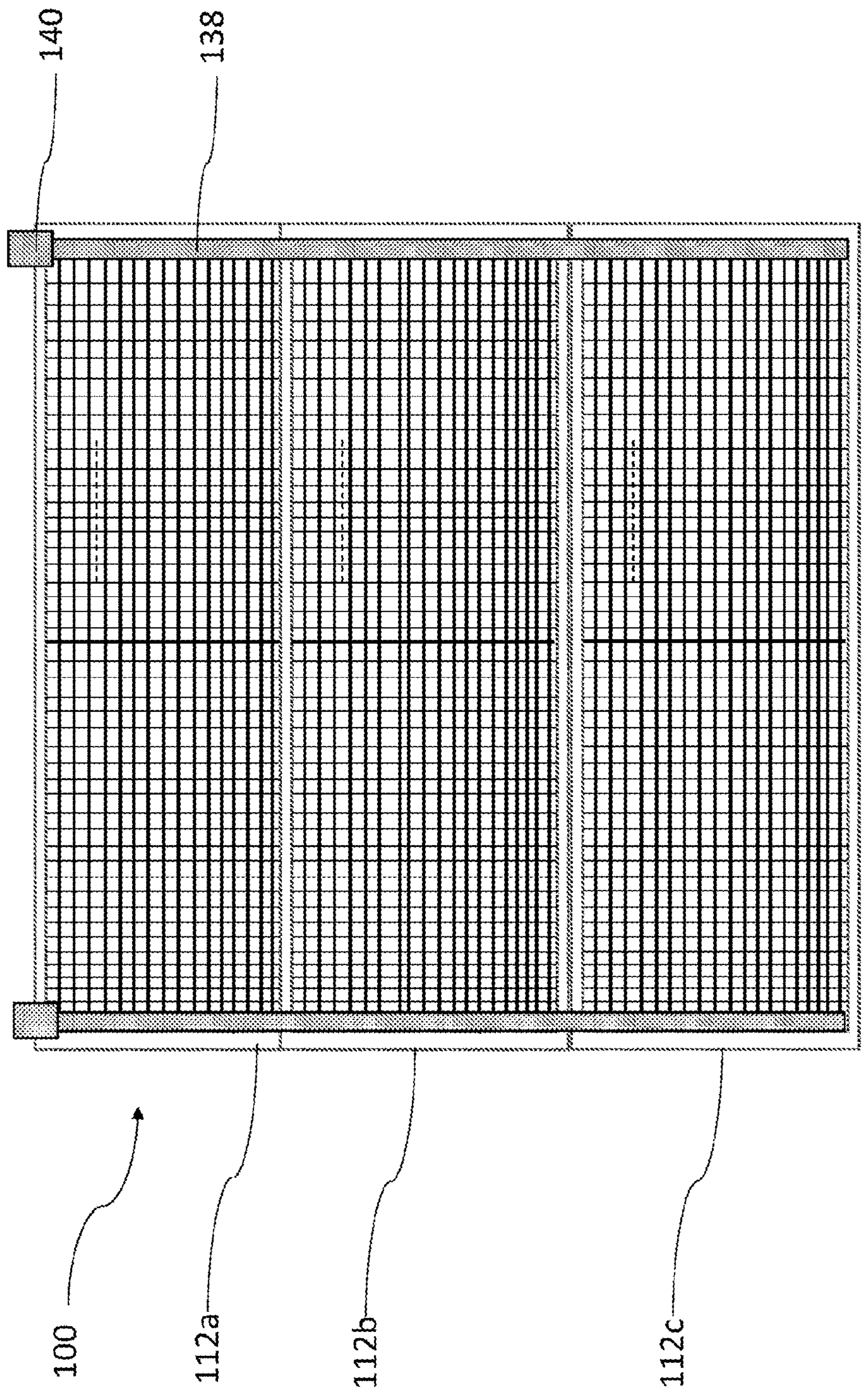
FIG. 19 is a rear view of a schematic plan view of a semi-transparent photovoltaic insulated glass unit composed of three submodules.

Referring now to FIGS. 17, 18, and 19, multiple semitransparent photovoltaic submodules 112 (or a submodule subassembly) may be combined to create a complete photovoltaic integrated glass unit (PV IGU) 100. It should be understood that the submodules 112 may be constructed as described above with reference to submodule 12. As shown in FIG. 17, a plurality of submodules 112*a, b*, and *c*, may be laminated between two layers of glass, a glass backing layer 128 and an outer glass layer 132. In one embodiment, the inner surfaces 120 of the plurality of submodules 112*a, b*, and *c*, made of the metal back contact layer as described above with reference to submodule 12, may be laminated to a 3 mm thick monolithic glass backing layer 128, with a lamination layer 126 disposed therebetween.

In this embodiment, the outer surfaces 114 of the plurality of submodules 112*a, b*, and *c*, may be laminated to the inner surface of a second 3 mm thick monolithic outer glass layer 132, with another lamination layer 130 disposed therebetween. In one embodiment, there may be an amount of space 122*a* and 122*b* disposed between each module once they are laminated between or sandwiched between, the outer glass layer 132 and the glass backing layer 128. Generally, each glass layer 128 and 132 will be made of a single sheet of glass or other suitable material, such as those materials described with regard to glass backing layer 28. In one embodiment, each submodule 112*a, b*, and *c*, may be about 4 ft×2 ft in size, with the overall size of the subassembly 112 being about 4 ft×4 ft or 4 ft×6 ft or 4 ft×8 ft or 4 ft×10 ft or 4 ft×12 ft, etc.

To complete the PV IGU, a third inner glass layer 134 may be disposed toward the inside surface of the glass backing layer 128, separated from the glass backing layer 128 by a space 136, which is filled with an amount of argon gas or other suitable medium. In one embodiment, the space 136 is about 12 mm wide.

Referring now to FIG. 19, as in FIGS. 12 and 13, buss tape 138 and junction box(es) 140 may be added to the periphery of the PV IGU. Any suitable buss tape material or junction boxes may be used.

Although the description has been focused on the use of the semitransparent photovoltaic module in a building window application, this module may have many more applications. For example, curved glass modules may be created using the vertical vapor deposition process and a scribing system having an adjustable focus along the z-axis to enable the focal spot to follow the curvature of the glass. This curved module may be used for windshields, windows, and sunroofs of automobiles. The power generated from these solar powered panels may then be converted for use in the automobile's system.

This written description sets forth the best mode of carrying out the invention and describes the invention so as to enable a person of ordinary skill in the art to make and use the invention, by presenting examples of the elements recited in the claims. The detailed descriptions of those elements do not impose limitations that are not recited in the claims, either literally or under the doctrine of equivalents.

What is claimed is:

1. A semitransparent photovoltaic module comprising:

at least one semitransparent submodule having a visible light transmission of about 7% to about 70% comprising:

an outer surface and an inner surface and comprising a first glass layer, a transparent conducting oxide layer, a semiconductor layer, and a metal back contact layer, wherein the submodule further comprises a plurality of interconnection scribes extending in a first direction across the submodule and a plurality of light transmission scribes disposed perpendicularly to the plurality of interconnection scribes in a second direction that is substantially perpendicular to the first direction;

wherein at least one of the plurality of interconnection scribes is disposed through the transparent conducting oxide layer and the semiconductor layer, but not the first glass layer or the back contact layer; and wherein the plurality of light transmission scribes are disposed through at least part of the semiconductor layer.

2. The semitransparent photovoltaic module of claim 1, wherein the module further comprises a first lamination layer disposed on the inner surface of the at least one submodule and a glass backing layer disposed on an inner surface of the first lamination layer.

3. The semitransparent photovoltaic module of claim 1, wherein the semiconductor layer is made of CdTe, CdSeTe, CdSe, CdZnTe, CdMgTe, CdHgTe, ZnTe, GaAs, AlGaAs, GaAsP, a-Si, CIGS, perskovite, or combinations thereof.

4. The semitransparent photovoltaic module of claim 3, wherein the semiconductor layer comprises CdTe.

5. The semitransparent photovoltaic module of claim 1, wherein the module is capable of generating about 60 W to about 120 W of power.

6. The semitransparent photovoltaic module of claim 1, wherein the light transmission scribes are about 0.05 mm to about 1 mm wide.

7. The semitransparent photovoltaic module of claim 6, wherein the plurality of light transmission scribes are disposed about 0.25 mm to about 5.0 mm apart.

8. The semitransparent photovoltaic module of claim 2, wherein the module comprises a plurality of submodules, a second lamination layer, and a glass outer layer,
 wherein the plurality of submodules are positioned in sequence between an outer surface of the first lamination layer and an inner surface of the second lamination layer.

9. A method of making a semitransparent photovoltaic module, the method comprising:
 providing at least one semitransparent submodule having a visible light transmission of about 7% to about 70% having an outer surface and an inner surface, the semitransparent submodule comprising:
  a first glass layer, a transparent conducting oxide layer, a semiconductor layer, and a metal back contact layer,
  wherein the submodule further comprises a plurality of interconnection scribes extending in a first direction across the submodule and a plurality of light transmission scribes disposed perpendicularly to the plurality of interconnection scribes in a second direction that is substantially perpendicular to the first direction;
   wherein at least one of the plurality of interconnection scribes is disposed through the transparent conducting oxide layer and the semiconductor layer, but not the first glass layer or the back contact layer; and
  wherein the plurality of light transmission scribes are created using a pulsed laser ablation process with a wavelength of about 1064 nm; and
  wherein the plurality of light transmission scribes are disposed through at least part of the semiconductor layer.

10. The method of claim 9, wherein the method further comprises applying a first lamination layer disposed on the inner surface of the at least one submodule and a glass backing layer disposed on an inner surface of the first lamination layer.

11. The method of claim 9, wherein the semiconductor layer is made of CdTe, CdSeTe, CdSe, CdZnTe, CdMgTe, CdHgTe, ZnTe, GaAs, AlGaAs, GaAsP, a-Si, perskovite, CIGS, or combinations thereof.

12. The method of claim 11, wherein the semiconductor layer comprises CdTe.

13. The method of claim 10, wherein the method further comprises providing a plurality of submodules, a second lamination layer, and a glass outer layer;
 wherein the plurality of submodules are positioned in sequence between an outer surface of the first lamination layer and an inner surface of the second lamination layer.

14. The method of claim 9, wherein the semitransparent photovoltaic module is capable of generating about 60 W to about 120 W of power.

15. The method of claim 9, wherein the light transmission scribes are about 0.05 mm to about 1 mm wide, with a pitch of about 1 mm to about 5 mm.

16. The method of claim 9, wherein the plurality of light transmission scribes are disposed about 0.25 mm to about 5.0 mm apart.

17. A method of preventing power loss in a photovoltaic module due to an isolated electrical shunt, the method comprising: providing a semitransparent photovoltaic module comprising:
 at least one submodule having an outer surface and an inner surface and comprising a first glass layer, a transparent conducting oxide layer, a semiconductor layer, and a metal back contact layer,
 wherein the submodule further comprises a plurality of interconnection scribes extending in a first direction across the submodule and a plurality of light transmission scribes disposed perpendicularly to the plurality of interconnection scribes in a second direction that is substantially perpendicular to the first direction; and
 wherein at least one of the plurality of interconnection scribes is disposed through the transparent conducting oxide layer and the semiconductor layer, but not the first glass layer or the back contact layer and at least one of the plurality of light transmission scribes is disposed through at least part of the semiconductor layer; and
 wherein the interconnection scribes and light transmission scribes lines of laser ablation are disposed on the submodule in a pattern that prevents or inhibits electrical current from flowing from one line to adjacent lines.

* * * * *